United States Patent [19]
Pietruszynski et al.

[11] Patent Number: 6,141,169
[45] Date of Patent: Oct. 31, 2000

[54] SYSTEM AND METHOD FOR CONTROL OF LOW FREQUENCY INPUT LEVELS TO AN AMPLIFIER AND COMPENSATION OF INPUT OFFSETS OF THE AMPLIFIER

[75] Inventors: David M. Pietruszynski, Austin; Jerrell P. Hein, Driftwood, both of Tex.; William G. Bliss, Thornton; German S. Feyh, Boulder, both of Colo.

[73] Assignee: Cirrus Logic, Inc., Austin, Tex.

[21] Appl. No.: 08/956,569

[22] Filed: Oct. 23, 1997

[51] Int. Cl.[7] .................................. G11B 5/02; H03F 3/45
[52] U.S. Cl. ............................................... 360/67; 330/260
[58] Field of Search .................................. 360/67, 46, 61, 360/25; 369/48, 59; 330/259, 260

[56] References Cited

U.S. PATENT DOCUMENTS

| | | | |
|---|---|---|---|
| 3,931,584 | 1/1976 | Motley et al. | 330/129 |
| 3,969,683 | 7/1976 | Fabricius | 330/144 |
| 4,213,097 | 7/1980 | Chiu et al. | 330/51 |
| 4,322,687 | 3/1982 | Dwarakanath et al. | 330/9 |
| 4,634,997 | 1/1987 | Tompsett et al. | 330/284 |
| 4,757,395 | 7/1988 | Nishikawa et al. | 360/46 |
| 4,833,418 | 5/1989 | Quintus et al. | 330/9 |
| 4,943,807 | 7/1990 | Early et al. | 341/120 |
| 5,297,184 | 3/1994 | Behrens et al. | 375/98 |
| 5,397,944 | 3/1995 | DuPuis | 327/307 |
| 5,416,437 | 5/1995 | Contreras et al. | 327/536 |
| 5,424,689 | 6/1995 | Gillig et al. | 331/17 |
| 5,432,475 | 7/1995 | Fukahori | 330/254 |
| 5,459,679 | 10/1995 | Ziperovich | 364/602 |
| 5,583,706 | 12/1996 | Dudley et al. | 360/46 |
| 5,619,169 | 4/1997 | Matsuura | 330/254 |
| 5,648,738 | 7/1997 | Welland et al. | 327/307 |
| 5,844,920 | 12/1998 | Zook et al. | 371/40.14 |

OTHER PUBLICATIONS

Waldera, Jay, "Who's afraid of thermal asperities in MR drives?" *Data Storage* 55–62, May/Jun. 1997.

Welland et al., "Implementation of a Digital Read/Write Channel with EEPR4 Detection", *Magnetics*, 31(2):1180–1185, Mar. 1995.

*Primary Examiner*—W. Chris Kim
*Attorney, Agent, or Firm*—Richard D. Eagan; Dan Shifrin; J. P. Violette

[57] ABSTRACT

A system and method for an amplifier control circuit is provided which does not require the use of a large off-chip or on-chip capacitor for achieving a low frequency coupling corner, while still effectively allowing AC coupling the data detection circuit. In addition, the input offset voltage to the amplifier may be compensated and the inherent random low frequency input voltages provided to the amplifier may be controlled or canceled. Further, the amplifier control circuitry includes a freeze capability which allows the control circuitry to halt all updates to the input offset/low frequency control circuit when the voltage input signal is interrupted. In addition low frequency control and offset compensation updates may be performed without causing large output signal glitches so that the integrity of the received signal will not be compromised. In a preferred embodiment the system and method may be utilized for data detection circuits utilized in conjunction with optical disks.

14 Claims, 7 Drawing Sheets

SYSTEM AND METHOD FOR CONTROL OF LOW FREQUENCY INPUT LEVELS TO AN AMPLIFIER AND COMPENSATION OF INPUT OFFSETS OF THE AMPLIFIER

BACKGROUND OF INVENTION

1. Field of the Invention

The present invention relates to the correction or compensation of amplifier input offsets and the control of low frequency variations in amplifier input signals, and more particularly, control of amplifier input offsets and control of low frequency variations in amplifier input signals utilized in data detection circuits such as, for example, data detection circuits used with optical data disks.

2. Description of Related Art

In many data detection circuits an amplifier is used to boost an electrical signal received from a data storage media, such as a CD-ROM, DVD, or other optical disk, magnetic hard disk, etc. In the case of optical disks, the electrical signal is generated from light that is reflected off an optical disk and converted to electrical pulses. The electrical pulses may then be transmitted to the front end of a variable gain amplifier prior for further signal processing. Data detection circuits may also be combined with circuitry for write operations. For example, circuitry for both read and write operations may be combined read/write channel circuits utilized with magnetic hard disks. In contrast, some optical disks are utilized in read only systems and thus the data detection circuit need not be combined with write circuitry.

In many data detection applications, the received electrical signal represents a corrupted digital signal which is reconstructed downstream of the amplifier. In these applications, the spectral content of the received signal may have significant energy at very low frequencies. In addition to the low frequency information content, the input offset voltage of the amplifier is frequently as large or larger than the amplitude of the received signal making it imperative that an offset cancellation scheme be used to cancel the DC offset of the amplifier while still passing the low frequency and high frequency signal spectra.

When implementing amplifiers in the data detection circuitry of optical storage systems, additional concerns exist. For example, the optical pickup (or read head) may operate at a higher supply voltage level than the signal processing circuitry of the data detection circuit. Typical optical pickups may operate at voltage levels such as 5 volts whereas it may be desirable to implement data detection circuit using a 3.3 volt supply or less CMOS circuitry. Thus, it would be desirable to protect the amplifier circuitry from the higher voltage levels produced by the optical pickup without distorting the data signal. Furthermore, because of the very high speed signals encountered with optical disks, it is desirable that the amplifier have a wide enough bandwidth to be able to process the data without attenuating the high frequency information. To optimize the amplifier bandwidth vs. current usage relationship, it is desirable to operate the amplifier in a region where the quiescent point is approximately half the supply voltage so that the whole dynamic range of the amplifier may be utilized while maximum bias current flows in the amplifier. To achieve such results, compensation of the input offset voltage of the amplifier (which is an inherent error source in amplifiers and which may result from a number of factors) must be performed.

Attempts to maintain the voltage levels at the inputs to the variable gain amplifier relatively constant to maximize the dynamic range of the amplifier are further complicated in that the signals from the optical pickup may exhibit low frequency variations. The data rates transmitted from the data storage media may typically be centered at 25 to 30 MHz and the low frequency variations typically less than 5 kHz and more generally from 1 kHz to DC. Such input signal low frequency variations may result from a number of undesirable factors including the inaccuracies in the tracking ability of the optical pickup, thermal drift of the transimpedance amplifier within the optical pickup, disk reflectivity variations, and disk spin flutter. Thus, it is desirable to control the low frequency variations in amplifier input signals.

Optical disks also present challenges in that defects on the disk (for example, particles or disk manufacturing defects) may cause low frequency disturbances, interruptions, gaps, data spikes, data dropouts, data occlusions or other data abnormalities (collectively called data disturbance) in the input signal. These defects thus complicate the input offset compensation and control of the low frequency variations in amplifier input signals since it may be desirable to hold constant (or "freeze") offset adjustments when such defects are encountered.

Figure 1:
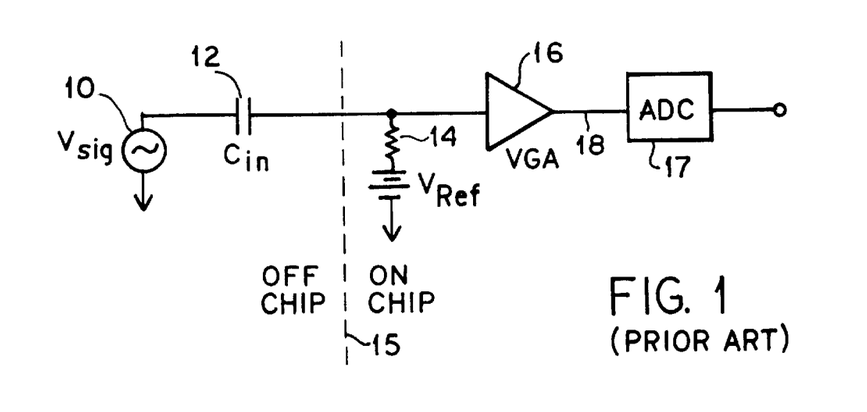
FIG. 1 is a block diagram of a prior art method for coupling low frequency signals to an amplifier.

In the prior art, methods for passing low frequency signals to variable gain amplifiers without passing unwanted large low frequency variations have included simple AC coupling techniques that use resistors and large value capacitors to couple signals onto an integrated circuit. Because of long time constants (low frequency cutoff), the capacitor is large. Large capacitors require prohibitively large areas and are not typically integrated with the amplifier. Thus, these capacitors are off-chip (i.e. not within the integrated circuit which contains the amplifier and other data detection circuitry) as shown in FIG. 1. FIG. 1 illustrates a signal source $V_{sig}$ 10 (for example a signal from an optical disk) which is amplified with a variable gain amplifier (VGA) 16. The amplifier output 18 is then provided for further signal processing by the remaining portions of the data detection circuitry which may include, for example, an analog to digital converter (ADC) 17. Dashed line 15 indicates a division between off-chip structures ($V_{sig}$ 10 and the capacitor $C_{in}$ 12) and the on-chip structures (VGA 16 and the resistor 14). Disadvantages of the above approach are that an off-chip capacitor is required, and a separate circuit is needed to compensate the input offset voltage of the variable gain amplifier. Moreover, such systems generally are unable to freeze or hold the low frequency control and offset compensation during data disturbances. Further, servo information is often present at very low frequencies and the use of off-chip capacitors would lose such information prior to the data inputs of a data detection circuit. Because many data detection systems are highly integrated and incorporate servo circuitry, such a loss of information is generally unacceptable.

Figure 2:
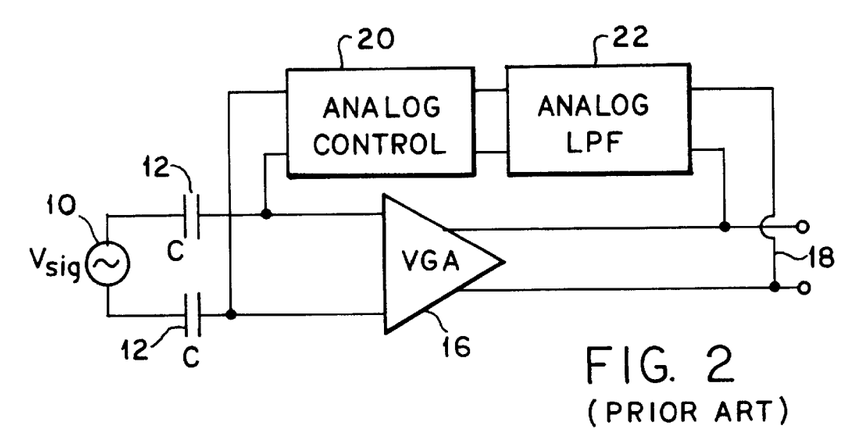
FIG. 2 is block diagrams of prior art offset cancellation techniques.

Prior art continuous time input offset cancellation methods have included control loops which sense the output offset of an amplifier and then feedback a voltage or current signal that cancels the random offset built into the amplifier. These circuits can also be used to cancel offsets from previous amplifier stages. FIG. 2 shows an example of such system. FIG. 2 illustrates the use of an analog servo loop technique for canceling offsets. As shown in FIG. 2, a feedback loop from the outputs 18 of the VGA 16 is provided through an analog low pass filter (LPF) 22 and analog control circuitry 20. However, the capability of freezing the amplifier control is not possible when defects or gaps are encountered. Also, the size of on chip capacitor(s) required in the low pass filter are still prohibitive when the coupling frequency is low.

SUMMARY OF INVENTION

The problems and difficulties described above may be addressed by use of all or part of the control techniques disclosed herein. More particularly, an amplifier control circuit is provided which does not require the use of a large off-chip or on-chip capacitor for achieving a low frequency coupling corner, while still effectively allowing AC coupling of the data detection circuit. In addition, the input offset of the amplifier may be compensated and the random low frequency signals present in the input data provided to the amplifier may be controlled or canceled. Further, the amplifier control circuitry includes a freeze capability which allows the control circuitry to halt all updates to the offset/low frequency control circuit when the voltage input signal is interrupted, such as may occur from a disk defect. In addition, low frequency control and offset compensation updates may be performed without causing large output signal glitches so that the integrity of the received signal will not be compromised. In a preferred embodiment the system and method may be utilized for data detection circuits utilized in conjunction with optical disks.

In one embodiment, a method of operating a data storage system is provided. The method may include providing data from a disk storage medium, coupling the data to a data detection circuit input, presenting the data to at least one amplifier within the data detection circuit, and generating a control signal from a control loop around the amplifier. The control signal may be coupled to at least one amplifier input node. The method also includes compensating for the input offset voltage of the amplifier with the control signal, and controlling the low frequency content of the data with the control signal. The method may further include interrupting the controlling and compensating steps when a disturbance in the data occurs. In another embodiment, a method of operating a data storage system may include transmitting data from a data storage medium to a data detection circuit, amplifying the data with an amplifier within the data detection circuit, controlling at least one amplifier input based at least in part upon an output of the amplifier, and halting the control of the amplifier input when a data disturbance occurs during the transmitting step.

In another embodiment, method of operating a data detection circuit is provided. The method may comprise providing input data to an amplifier, generating control signals based upon an output of the amplifier for application to an input of the amplifier, and ceasing or holding the application of the control signals to the input of the amplifier when the input data is interrupted.

In yet another embodiment, a method of controlling the output of an amplifier is provided. This method may include amplifying a data signal with the amplifier to generate an amplifier output where the data signal includes unwanted low frequency variations and the amplifier exhibits input offsets. The method may further include coupling a control loop between an amplifier input node and the amplifier output node. The method may also include compensating the input offset of the amplifier and controlling the low frequency content of the data signal with the control loop to minimize offset voltages and low frequency signals at the amplifier output node.

In another embodiment, a method of operating an electrical circuit is provided. The method may include providing a single ended input signal to a first input node of a differential amplifier, providing a control loop from an output of the amplifier to the first input node, and matching the amplifier input impedance at the second input node to the amplifier input impedance of the first input node. The method may further comprise compensating the amplifier input offset and controlling the low frequency content of the data signal with the control loop to minimize offset voltages and low frequency signals at the amplifier output node, and interrupting the compensating and controlling step when a disturbance in the data signal occurs.

In still another embodiment, a data storage system is provided. The data storage system may include a data storage medium and a data detection circuit coupled to the data storage medium to receive a data signal. The system may also include an amplifier within the data detection circuit, the amplifier coupled to the data signal, and a control loop coupled to an input and an output of the amplifier. The control loop may generate a control signal that is provided to the amplifier input to compensate for input offsets and control low frequency content of the data signal.

Another embodiment may include data detection circuit capable of being coupled to a data storage medium to receive a data signal. The circuit may include an amplifier within the data detection circuit, the amplifier coupled to the data signal, and means for simultaneously compensating the input offset voltage of the amplifier and controlling the low frequency content of the data signal, the means also allowing the compensation and control to be halted in a hold state. Another data detection circuit may include a data input and an amplifier coupled to the data input. The amplifier may include at least a first input and a first output. A control loop is coupled between at least the first input and at least the first output to provide at least one control signal to the first input. The circuit may further include a data disturbance signal coupled to the control loop, the control loop responsive to the data disturbance signal to halt or freeze the control signal.

Yet another data detection circuit is also provided. This data detection circuit may comprise a plurality of differential data inputs, the differential data inputs capable of receiving data from a data storage medium. The circuit further includes at least one differential amplifier, a first amplifier input node of the differential amplifier coupled to at least one of the plurality of differential data inputs and a second amplifier input node of the differential amplifier coupled to at least one of the plurality of differential data inputs. A control loop is coupled to the first amplifier input node and to at least one output node of the differential amplifier, and an impedance matching circuit is coupled to the second amplifier input node, the impedance matching circuit creating an input impedance at the second amplifier input node that matches an input impedance at the first amplifier input node.

BRIEF DESCRIPTION OF THE DRAWINGS

It is to be noted that the appended drawings illustrate only particular embodiments of the invention and are, therefore, not to be considered limiting of its scope, for the invention may include other effective embodiments.

DETAILED DESCRIPTION OF THE INVENTION

Figure 3:
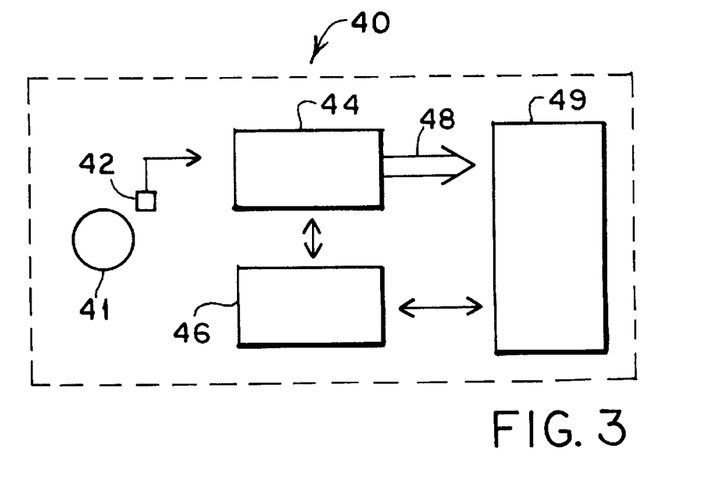
FIG. 3 is a block diagram of an optical disk data storage system.

FIG. 3 illustrates a data storage system 40 in which the present invention may be utilized. The data storage system may include a disk 41 and a read head 42. In one embodiment, the disk 41 may be an optical disk such as a CD-ROM or a DVD disk and the read head 42 may be an optical pickup such as holographic or astigmatic heads which utilize photodiode arrays to convert optical signals to electrical signals. Coupled to the read head 42 is a data detection circuit 44. In the case of an optical storage system, the data detection circuit 44 may be a DVD/CD-ROM DSP (Digital Signal Processor) and decoder circuit compatible with industry interface standards such as the standard IDE/ATA interface and more specifically the ATAPI (AT Attachment Packet Interface) interface. A local microcontroller 46 may be coupled to the data detection circuit 44. The microcontroller 46 and the data detection circuit 44 may also be coupled to a host computer 49. The data detection circuit 44 may be coupled to the host computer through a portion of the host computer's ATA bus 48. The optical disk, pickup head, microcontroller, and host computer may be any of a wide variety of commercially available components.

The data storage system 40 shown in FIG. 3 is just one illustrative example of a data storage system. Other data storage systems may also utilize the present invention. For example, magnetic disk drive systems utilizing a read channel circuit as a data detection circuit may also utilize the present invention. Further, though shown separately, various components of the data storage system may be combined or additional components may be considered to be part of the system including components such as RAM, ROM, power supply circuits, and other circuits. In addition, though shown as separate from the host computer, the data storage system may be integrally formed within a computer or alternatively, the data storage system 40 may be formed as a stand alone unit independent of a host computer. Moreover, certain features of the present invention are not limited to the use of data storage systems and may be utilized in many other electronic circuits in which amplifiers are present.

Figure 4:
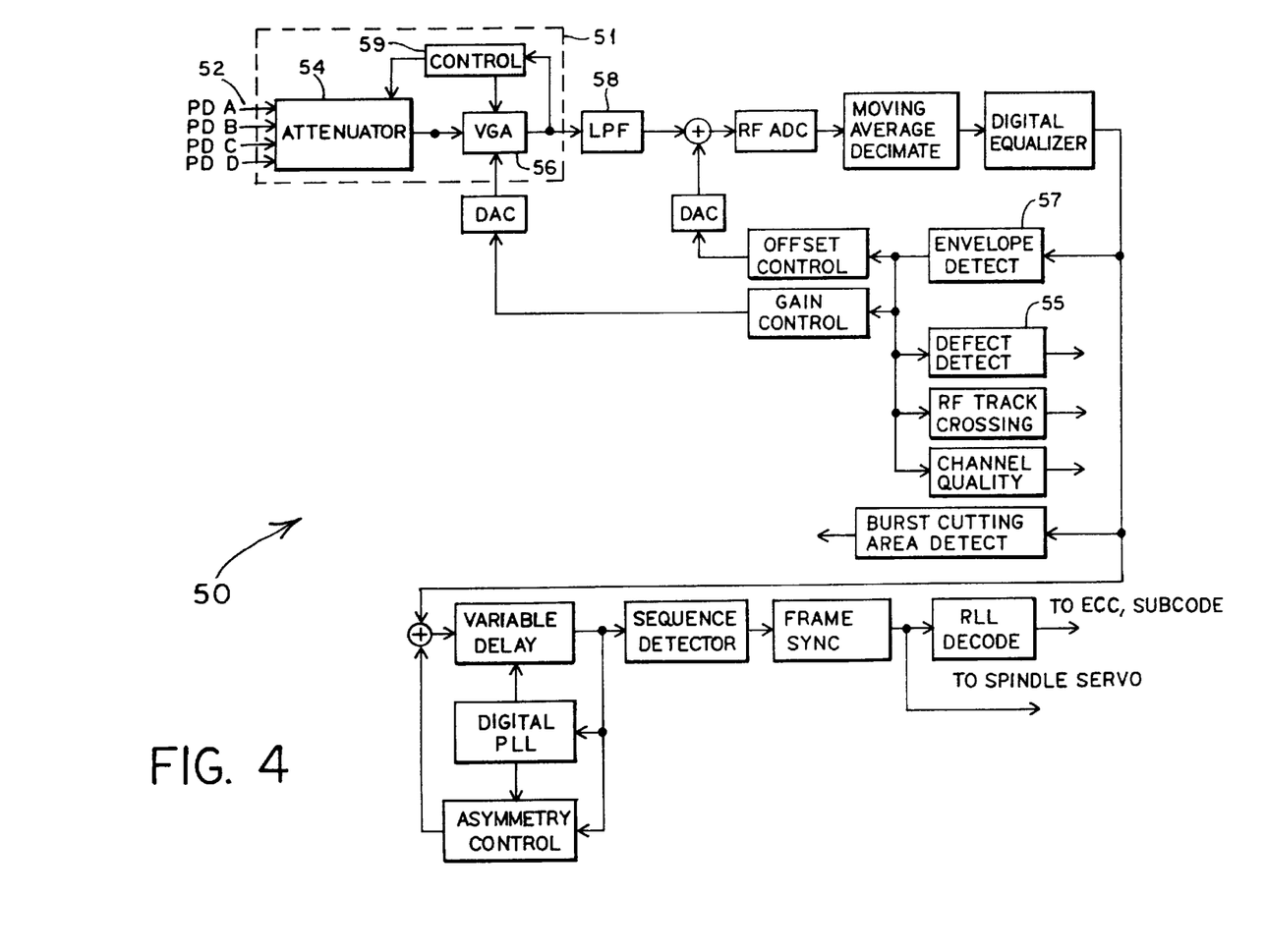
FIG. 4 is a block diagram of the data path of a data detection circuit.

FIG. 4 is a functional block diagram of a portion of the data detection circuit 44. In particular, the data channel 50 of an exemplary data detection circuit 44 is shown. It will be recognized that the data detection circuit may also include other circuitry, such as for example, servo amplifier circuitry, retiming or synchronization circuits, servo circuitry, decoder circuitry, interface circuitry, etc. It will also be recognized that the data channel 50 is just one exemplary data channel and that other data channel circuits may also utilize the disclosures made herein. As shown in FIG. 4, data inputs 52 (PD A, PD B, PD C, and PD D) are provided from an optical pickup. Each of the four inputs 52 may represent an output from one of four photodiodes (PD) within the optical pickup. Typically, the photodiode outputs are amplified with a transimpedance amplifier within the optical pickup. The electrical signals shown in FIG. 4 are displayed as single ended signals, however, it will be recognized that the signals may be differential signals and any illustrations or discussions herein may be equally applicable in single ended or differential systems.

The data inputs 52 are coupled to an attenuator 54. The attenuator serves to attenuate the data input signals since the data input signals may be operating at voltage levels that are higher than the maximum allowable voltage level for subsequent circuitry. The output of the attenuator 54 is provided to a variable gain amplifier 56. The control block 59 provides control (feedback) loops through which low frequency control and input offset compensation maybe be implemented. The output of the variable gain amplifier 56 is provided to a low pass anti-aliasing filter 58 through which the signals pass to the remaining signal processing circuitry as shown. The variable gain amplifier 56 may also receive an input from a digital to analog converter (DAC) for operation of the system level automatic gain control. Together, the attenuator 54, control block 59 and variable gain amplifier 56 may be viewed as a summation and gain circuit 51 as indicated by the dashed line in FIG. 4 and shown in more detail in an exemplary embodiment in FIG. 5.

Figure 5:
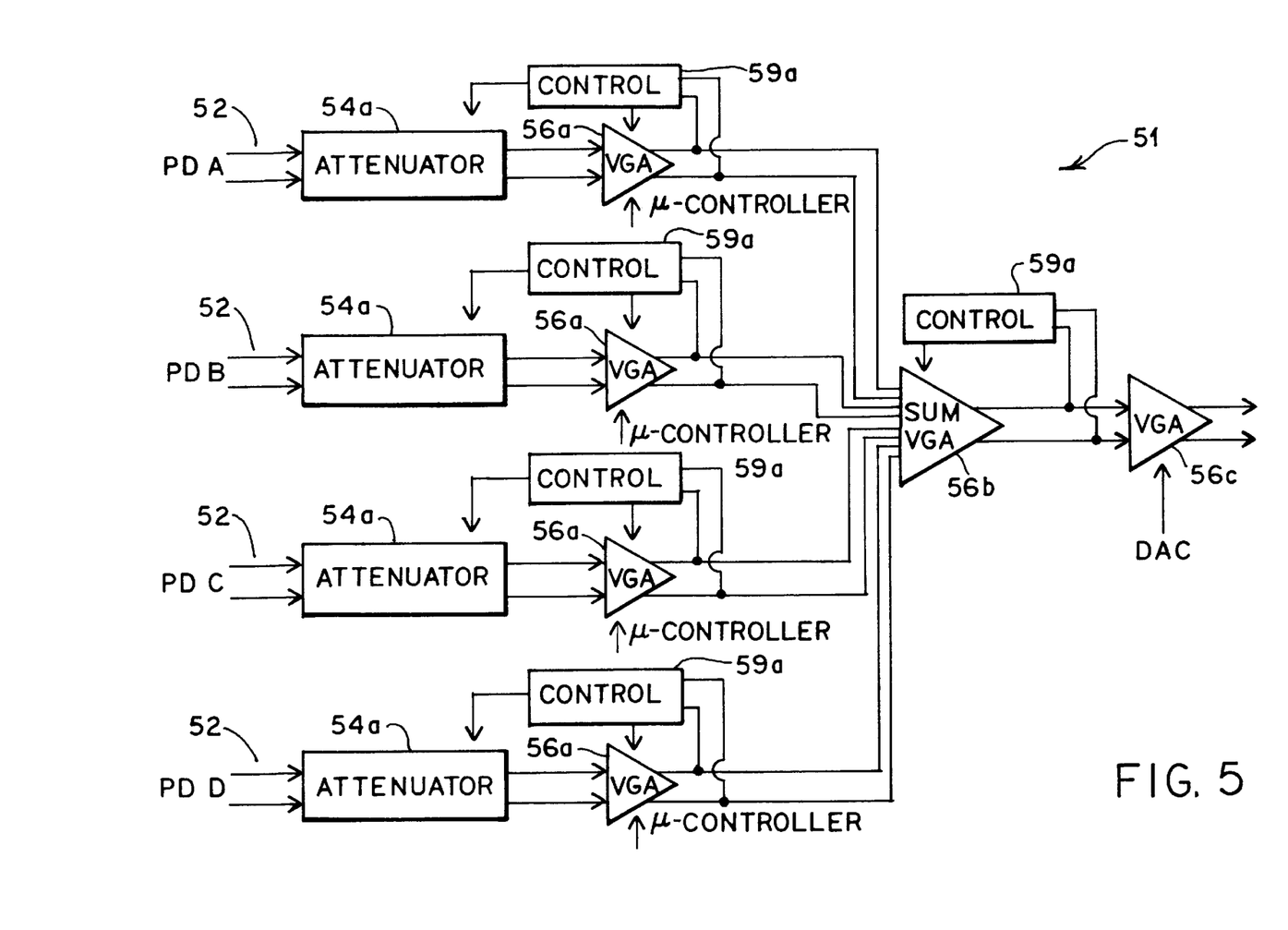
FIG. 5 is a block diagram of a portion of the circuit of FIG. 4.

As shown in FIG. 4, four inputs are provided to an attenuator 54 which provides an output to a single VGA 56. The summing of the four photodiode signals to the output of a single VGA output may be accomplished in a number of manners. One exemplary embodiment of circuit block 51 of FIG. 4 is shown in FIG. 5, however, many other embodiments may also utilize the invention described herein. As shown in FIG. 5, four attenuators 54a are provided, one for each differential data input PD A, PD B, PD C, and PD D. The outputs of the attenuators 54a are then provided to four static variable gain amplifiers 56a. Control circuits 59a are coupled to the outputs of each of the static variable gain amplifiers 56a for providing control signals to the static variable gain amplifiers 56a and the attenuators 54a. The outputs of the of the static variable gain amplifiers 56a are summed together in the summing variable gain amplifier 56b. A control circuit 59a may also be provided around the summing variable gain amplifier 56b. The output of the summing variable gain amplifier is then provided to the dynamic variable gain amplifier 56c. The control circuits 59a may provide input offset compensation and low frequency control of the signals provided to the amplifier as explained in more detail below.

As shown in FIG. 5, the gain control of the input signal may be accomplished by utilizing stages of variable gain amplifiers. More particularly, each stage may provide gain adjustments directed at compensating different types of variations in the input signal level. For example, as shown in FIG. 5, static variable gain amplifiers 56a and the dynamic variable gain amplifier 56c are included as part of the system level gain control. In particular, coarse system level gain control may be set statically by a microcontroller signal provided to the static variable gain amplifiers 56a. The coarse gain control may typically be utilized to account for systematic time invariant signal levels. The fine gain control may be set under real time (or dynamic) control by providing a DAC signal that is part of the automatic gain control loop to the dynamic variable gain amplifier 56c. The DAC signal may be an 8-bit signal providing 256 steps of fine gain control. Generally, the coarse gain control may be set prior to performing data read operations within the data storage system. Thus, the coarse gain control may be utilized before a read operation is begun to center the data signal within the dynamic range of the fine variable gain amplifier.

A system user may set and leave constant the coarse gain control based upon known system variables, or alternatively, signal strength detection circuitry could be used prior to read operations (either prior to each read or at some predetermined period) in order to determine the coarse gain necessary at any given time. No matter when the coarse gain control is set, it may be desirable to make coarse gain adjustments during a period other than when data is being read so that large voltage glitches do not occur during a data read. The fine gain control is thus utilized for fine real time variations in the input signal level. By utilizing separate coarse and fine gain control, the dynamic range of the overall gain control may be improved for a given DAC accuracy.

As mentioned above, FIG. 5 is one example embodiment for implementing the present invention. For example other embodiments may be utilized in which the four amplifiers 56a do not have individual control loops 59a provided around each amplifier. Rather, the outputs of the amplifiers may be summed together and a control loop may than provide a control signal to each individual amplifier based upon the output of the summation of the amplifier outputs. In such an embodiment the control circuit would compensate the input offsets of the amplifiers based upon an average of the input offsets of all of the amplifiers.

Figure 6:
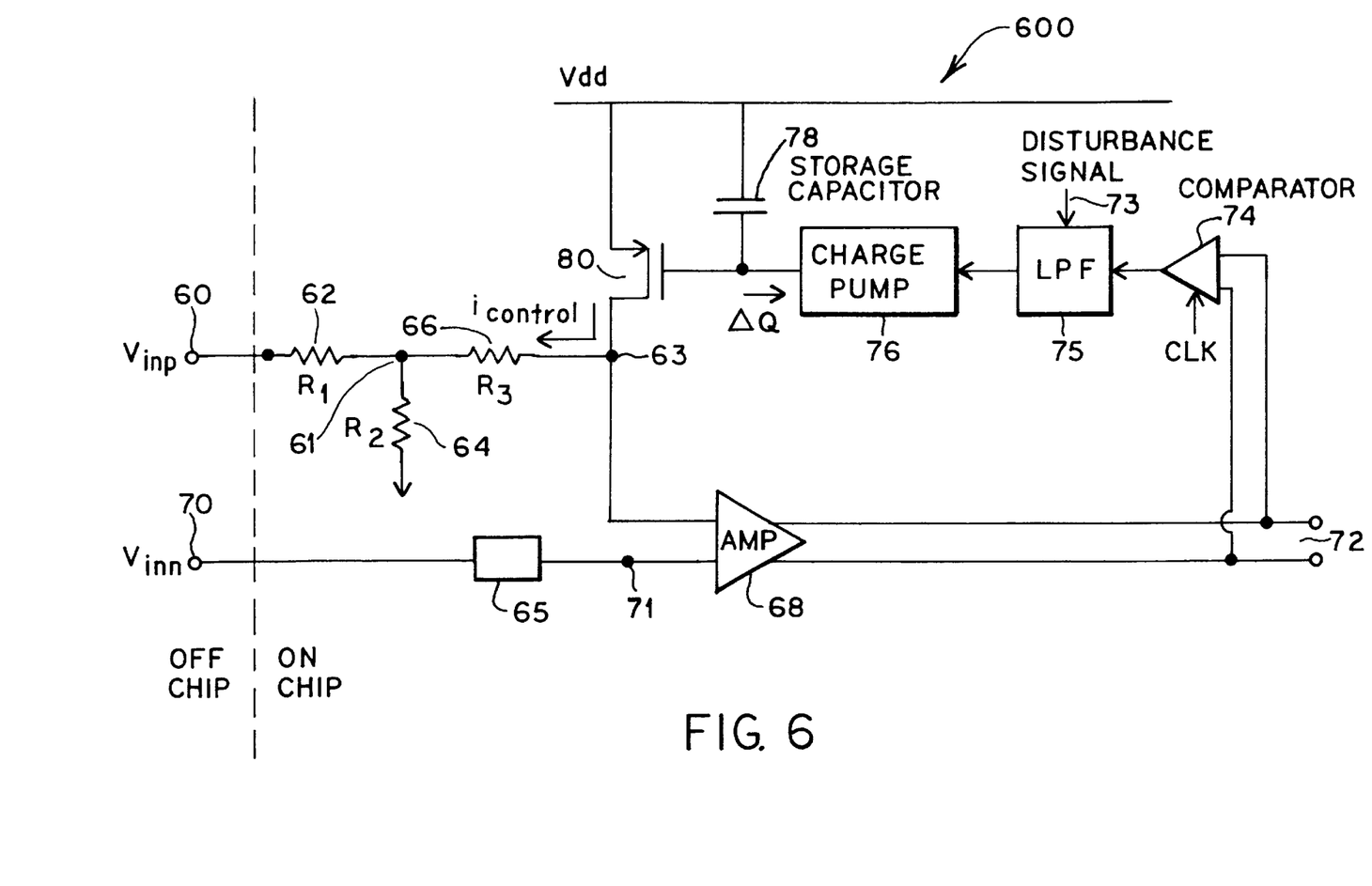
FIG. 6 is a diagram of the control circuits of the present invention.

An illustrative embodiment of the present invention may be seen with more particularity with reference to the circuit of FIG. 6, which is one embodiment of an attenuator 54a, control circuit 59a, and amplifier 56a of FIG. 5. As shown in FIG. 6, the control circuit 600 includes voltage inputs $V_{inp}$ 60 and $V_{inn}$ 70 which may be, for example, an electrical signal representative of data from an optical disk as provided by an optical pickup. Often the signals provided from an optical pickup may be single ended. This single ended signal may be provided to the voltage input $V_{inp}$ 60. For a single ended pickup output, the voltage input $V_{inn}$ 70 may then be coupled to the reference voltage that the pickup utilizes such as, for example, the ground of the pickup or a circuit board ground. Thus, the inputs may be considered pseudo-differential since the input signal is only provided on one of the two inputs and the other input is utilized to couple a desired reference voltage to the amplifier. Since high frequency noise interference rejection is of concern, the reference voltage may be coupled to the voltage input $V_{inn}$ 70 through an AC coupling capacitor so as to couple the circuit board noise to the voltage input. In this manner high frequency noise signals may be coupled to the amplifier as a common mode voltage signal thus minimizing the differential noise signal at the amplifier outputs.

The voltage signal 60 is provided to an on-chip input which is coupled to a resistor 62 ($R_1$). Resistor 62 is also connected to a node 61. Node 61 is also connected to resistor 64 ($R_2$) and resistor 66 ($R_3$) as shown. Resistors $R_1$ and $R_2$ together operate as the attenuator 54a of FIG. 5. The resistor 66 ($R_3$) is also connected to node 63. The current from node 63 to resistor $R_3$ is designated as the $i_{control}$ current as shown. Node 63 also serves as one input to an amplifier 68 while node 71 serves as the other input. An impedance matching circuit 65 is provided between the $V_{inn}$ 70 input and the amplifier input node 71. The matching circuit 65 provides an impedance which matches the impedance seen at the amplifier input node 63. By matching the impedances at each amplifier input node, the differential noise signals from on chip interference sources at the amplifier input may be minimized by making the on chip noise common mode. Thus for example, the use of impedance matched inputs may improve the amplifier power supply rejection ratio (PSRR) and help reject other sources of noise injection. By utilizing the psuedo-differential input techniques disclosed herein in combination with the matching circuit, effects of both off-chip and on-chip noise may be minimized. Thus, for example, without the matching circuitry on-chip noise (such as noise in the Vdd power supply) may be coupled into the amplifier as a differential signal at the amplifier inputs. However, using pseudo-differential inputs having the matching circuitry helps to minimize the impact of such on-chip noise at the differential outputs. An exemplary circuit for use as the impedance matching circuit is shown in more detail with reference to FIG. 8. The amplifier 68 may be, in an example embodiment, a variable gain amplifier such as amplifiers 56a and 56b of FIG. 5. The amplifier control principles disclosed herein, however, are not limited to amplifiers used for data detection circuits or even variable gain amplifiers, but rather are applicable to a wide range of applications and types of amplifiers.

The outputs 72 of the amplifier 68 are provided for transmitting data to further signal processing circuitry. A control loop is provided around the amplifier 68 from the amplifier outputs 72 to the amplifier input node 63. Though an ideal amplifier would provide a zero output voltage when no input voltage signal is provided, an input voltage offset is generally required due to various mismatches, temperature effects, etc. in order to provide a zero output voltage. The control loop shown provides a mechanism in which offset compensation is utilized in order to compensate for such amplifier inaccuracies.

As shown in FIG. 6, each of the amplifier outputs 72 are provided to a clocked analog comparator 74. The comparator 74 generates an ouptut signal indicating which output of the amplifier 68 is greater. The output of the comparator 74 is then provided to a digital low pass filter 75. The low pass filter 75 has a four bit binary output (the UP bit, the UP compliment UPB bit, the DOWN bit, and the DOWN compliment DOWNB bit) which are provided to a charge pump 76. The low pass filter also receives the data disturbance signal 73.

The output of the charge pump 76 is connected to a storage capacitor 78 and the gate of a transistor 80. The source of transistor 80 is connected to a voltage supply while the drain of transistor 80 is connected to node 63 to complete the control loop. Alternatively, rather than utilizing the comparator 74, an analog to digital converter may be used in its place. Together, the comparator 74, low pass filter 75, charge pump 76, the storage capacitor 78 and the transistor 80 may be viewed as part of the control circuit 59a of FIG. 5. It will be recognized, however, that a suitable control loop may be formed with different circuit elements and still accomplish the concepts of the present invention.

The control loop from the output of the amplifier 68 to the input node 63 operates such that the comparator 74 detects an offset difference between the amplifier outputs 72. The comparator 74 provides a signal to the charge pump 76 (through the LPF 75) which indicates which of the outputs of the amplifier 68 is greater. Depending upon whether the voltage at the input of the amplifier 68 needs to be adjusted upward or downward, the charge pump 76 either removes charge or adds charge respectively from the storage capacitor 78. The voltage on the storage capacitor 78 also controls the voltage on the gate of transistor 80 and the stored voltage is therefore converted to a current via the transconductance of transistor 80. The current through transistor 80 adjusts the control current, $i_{control}$, thus completing the servo loop and the offset compensation.

The attenuator structure formed by resistors $R_1$ and $R_2$ of FIG. 6 decreases the amplitude of the received input signal to protect the CMOS gates of the data detection circuitry which may be designed for lower breakdown levels than the operating levels of the input voltage source 60 (for example an optical pickup). In particular, if the input impedance of the amplifier 68 is assumed to be a relatively small capacitance, the voltage at node 61 will be:

$$V_{61} = (V_{in})\left(\frac{R_2}{R_1 + R_2}\right)$$

and the voltage appearing at node 63 will be:

$$V_{63} = \left[(V_{in})\left(\frac{R_2}{R_1 + R_2}\right)\right] + \left[(i_{control})\left(R_3 + \frac{R_1 R_2}{R_1 + R_2}\right)\right]$$

Therefore, the attenuation of the input voltage 60 through the attenuating circuitry of the resistors is dependent upon the resistor values and the voltage level at node 63 is dependent upon the resistor values and the $i_{control}$ current, which is dependent upon the control loop through comparator 74, charge pump 76, storage capacitor 78, and transistor 80.

Thus by varying the $i_{control}$ current as shown, the voltage at node 63 can be used to control the input voltage to the amplifier. If the control loop has a very narrow band width, this is equivalent to low frequency control of the amplifier input. Therefore, both the input offset of the amplifier and control of low frequency input voltages are controlled by one control loop.

Figure 7:
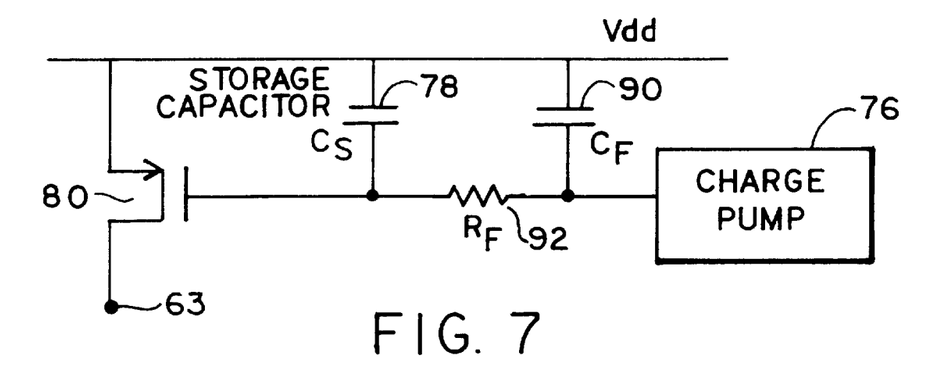
FIG. 7 is a diagram of an alternative control circuit of the present invention.

Several sources of voltage glitches may be present in the system disclosed herein. First, each time that the charge pump 76 provides a discrete amount of charge to the storage capacitor 78, a voltage glitch which may result in excessive noise at node 63 may occur since a relatively abrupt transition is made in the voltage at node 63. However, by varying the storage capacitor size, the charge pump current, and the time that the current is applied to the storage capacitor, the size of the update glitch may be controlled for a given transconductance of transistor 80. For example, the storage capacitor may have a capacitance of 20 pF, the charge pump may provide a 10 nA current for 8 nsec, and the transistor transconductance may be 600 μsiemens. Another source of voltage glitch results from channel charge and overlap capacitor voltage division. This voltage glitch may be reduced by the use of a low pass filter placed between the charge pump 76 and the storage capacitor 78 such as shown in FIG. 7. As shown in FIG. 7, the output of the charge pump 76 is provided to a filter capacitor 90 (CF) and a filter resistor 92 (RF). The filter resistor 92 is also coupled to the storage capacitor 78 and the gate of transistor 80 as shown.

In an alternative embodiment to that shown in FIG. 6, the charge pump 76, storage capacitor 78 and transconductance of transistor 80 may be replaced through the use of a digital to analog converter (DAC) since these circuit elements in FIG. 6 operate with a DAC like behavior. The use of a DAC in place of these elements may be independent or in conjunction with replacing the comparator 74 with an ADC. For example, an 11 or 12 bit differential current DAC may be utilized for providing more resolution of the output. However, the circuitry shown in FIG. 6 may be advantageous in that the circuit size may be smaller.

In yet another alternative embodiment, the resistor $R_3$ of FIG. 6 need not be utilized. By removing the resistor $R_3$ more current is utilized for the $i_{control}$ current and thus power usage is increased. However, though the power usage increases, the thermal noise performance will be improved. Thus, the use of and value of resistor $R_3$ will be dependent upon a balancing of power and noise considerations.

Thus, as described above a variable gain amplifier and control loop circuitry is provided to receive relatively high frequency disk data, for example data centered at 25 MHz. The control loop circuitry provides a single mechanism that corrects or calibrates both the amplifier's own input offset voltage but also minimizes the effect of low frequency variations (typically 5 KHz or less and more typically 1 KHz to DC) in the input signal provided to the amplifier from the optical pickup head. In this manner, inaccuracies in the input signal and inaccuracies in the amplifier may be addressed. Moreover, the control loop may be implemented without the use of large off-chip AC coupling capacitors. Because the control loop responds with updates relatively slowly even though the disk data may be changing at a high frequency, the effective AC coupling corner provided by the control loop is low. Moreover, the control loop allows for continuous operation of the control loop. Thus, control (or calibration) may be provided continuously. Such continuous calibration is particularly advantages in optical disk data storage systems where data is often provided continuously without predetermined segmentation of the data such as often provided by arrangement of data sectors in magnetic disks.

However, though the control loop may be providing updates at a continuous but relatively slow rate, the detection of disturbances, interruptions, gaps, data spikes, data dropouts, data occlusions or other data abnormalitites in the data signal being transmitted from the storage media (collectively called data disturbance) in the high frequency may occur relatively quickly. When a data disturbance is detected, the control loop provided herein allows for a quick freeze or holding of the control loop. Thus, when a data disturbance is detected the updates from the control loop may be quickly held so that changes in the polarity of the offset corrections are not made based upon data disturbances. Moreover, when it has been detected that a data disturbance has ceased, the control loop allows for a fast recovery from the freeze or hold state. Because the comparator is placed in the control and because the control loop allows for the offset and low frequency control to be held, the control loop provided herein is a non-linear control loop.

The hold or freeze mechanism of the control loop my be activated when a data disturbance is detected during the digital processing of the data. For example, the digital logic such as the ADC shown in FIG. 4 may be operating at high frequencies such as 118 MHz. An envelop detector 57 and a defect detect circuit 55 may be utilized to determine when a gap in the data signal from the disk (i.e. a data disturbance) has occurred by sensing changes in the data envelop and sensing the absence of a transition. When such a disturbance is detected a disturbance signal 73 may be provided to the low pass filter 75 of FIG. 6.

The low pass filter output bits (UP, UPB, DOWN, and DOWNB) may have three states, an up state (UP bit asserted), a down state (DOWN bit asserted) or a no change state (neither the UP or DOWN bits asserted. In response to the data disturbance signal 73 the output of the low pass filter may be changed to the no change state. More particularly, when the comparator 74 indicates that an increase in the voltage at the amplifier input node 63 is required, the loop filter UP bit may be asserted and when the comparator 74 indicates that a decrease in the voltage at the amplifier input node 63 is required, the loop filter DOWN bit may be asserted. However, when a data disturbance is detected the data disturbance signal 73 may override loop filter output such that neither the UP nor DOWN bit are asserted. Thus, when a data disturbance is detected, the low pass filter may be controlled to provide a necessary output to the charge pump so that the charge pump does not change the charge on the storage capacitor. Thus, in response to the low pass filter output bits, the charge pump may be controlled to add, remove or make no change to the charge on the storage capacitor. In this manner when a data disturbance is detected the charge pump updates may be frozen and the loop control thus held constant. It will be recognized that the freeze or hold of the control loop may be accomplished in other manners without the use of the loop filter. For example, the charge pump may be designed to directly receive the comparator output and the data disturbance signal and still achieve the benefits of the present invention as disclosed herein.

In this manner the control loop may be viewed as having two modes of operation. In a first mode which may be denoted as a normal operating mode (when data disturbances are not detected), the control loop operates as a high pass filter having a pole frequency sufficient to eliminate a substantial amount of the low frequency offset (for example 1 kHz). In a second mode which may be denoted as a hold mode (when a data disturbance has been detected), the control loop is held at its last value, thus, the pole frequency of the high pass filter approaches zero. In one embodiment, it may be desirable to allow such a hold mode to last up to approximately 1 msec.

During circuit operations it may be desirable to provide more than one rate of updates by the control loop. For example, the comparator 74 of FIG. 6 may be clocked at 118 MHz. However, the output of the low pass filter 75 may be clocked at only 1.84 MHz when data is being read from the disk so that updates to the charge pump (and any associtated glitches) are minimized during sensitive data read operations. Further, when data is not being read from the optical disk but rather a seek operation is being performed as the optical pickup is moving rapidly from one point to another on a disk, the low pass filter may be clocked to provide updates at the 118 MHz rate.

Figure 8:
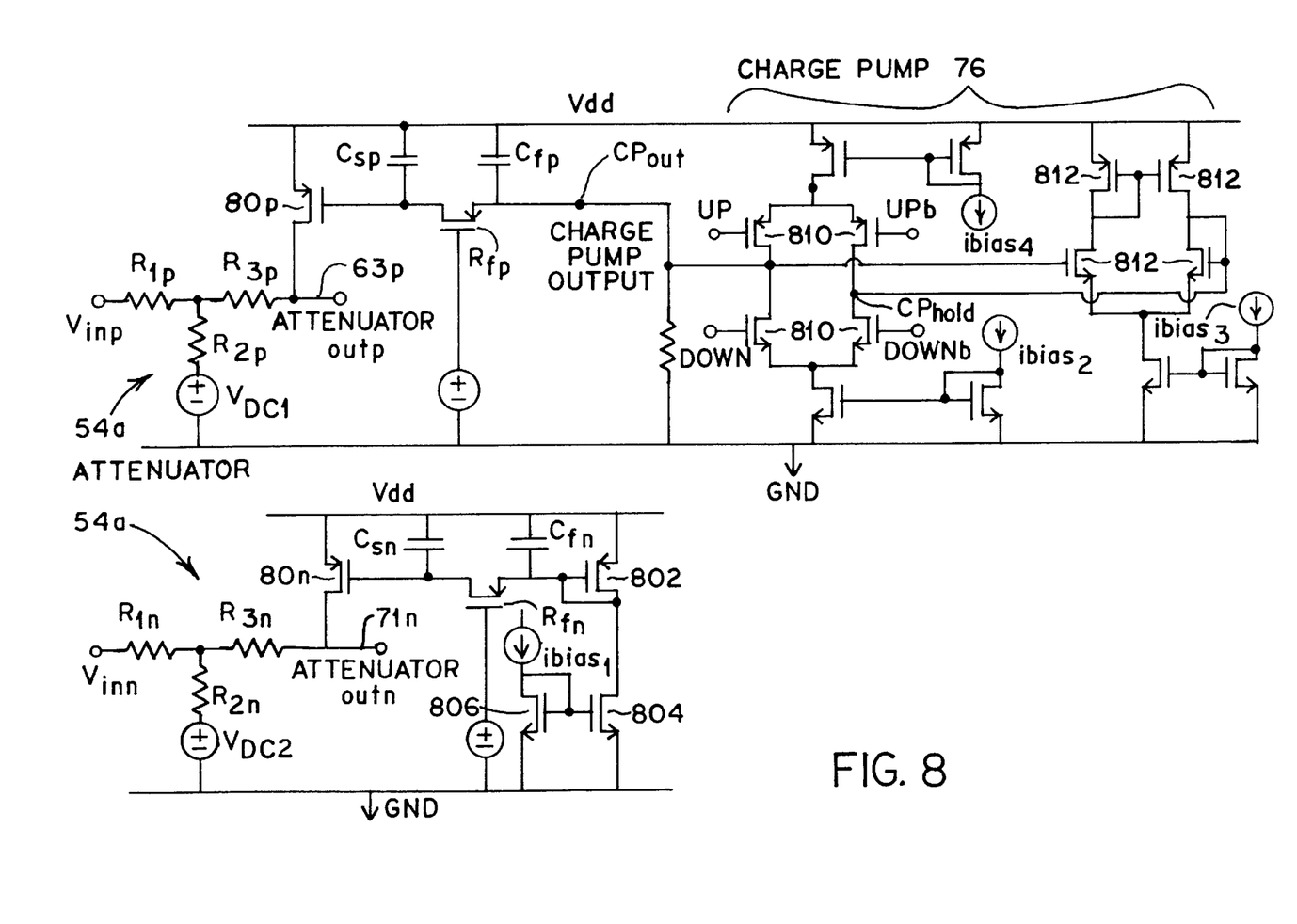
FIG. 8 is illustrative embodiment of a portion of the control circuits of the present invention.

The principles of the present invention may be obtained by utilizing any of a variety of amplifiers, comparators, low pass filters, or charge pumps for those respective elements of the circuit of FIG. 6 or even replacing those elements with other circuitry such ADCs and/or DACs. It will be recognized that the specific circuit elements chosen may be dependent upon the application (i.e., optical data detection, magnetic detection, other amplification purposes, etc.) and the various design specifications, rules and criteria. An example circuit for use as the charge pump 76, attenuator, storage capacitor 78, and filter is shown in FIG. 8. Such a charge pump may be known as a steered current charge pump. A steered current charge pump may be utilized because such charge pumps operate well at high speeds. In particular, rather than turning the charge pump on or off, a steered current charge pump operates such that current may always be flowing and when a change is desired in the output current, current is merely steered to or from the output in the desired amount. Other types of charge pumps may also be utilized.

Within FIG. 8, the differential voltage inputs $V_{inp}$ and $V_{inn}$ (which may correspond to an input from one optical pickup photodiode) are provided to the attenuator 54a. Each input $V_{inp}$ and $V_{inn}$ is attenuated through corresponding resistors $R_{1p}$, $R_{2p}$, and $R_{3p}$, and $R_{1n}$, $R_{2n}$, and $R_{3n}$ respectively (as utilized herein, corresponding structures for the differential signals will be denoted with a "p" or "n"). The attenuator outputs are provided at nodes 63 and 71, which in turn will be connected to the amplifier inputs (not shown). The attenuator outputs 63 and 71 are connected to the transconductance transistor 80p and 80n respectively. The storage capacitors $C_{sp}$ and $C_{sn}$ and the filter capacitors $C_{fp}$ and $C_{fn}$ are also provided. The filter resistance $R_f$ as shown in FIG. 7 is provided through the use of transistors which are connected to bias voltages as indicated by the resistances $R_{fp}$ and $R_{fn}$. The input to the filter formed by $C_{fn}$ and $R_{fn}$ is provided by three transistors 802, 804, and 806 which are biased through an $ibias_1$ current source as shown to set the input common mode voltage.

The storage capacitor $C_{sn}$, filter capacitor $C_{fn}$, filter resistor $R_{fn}$, transistor 80n and resistors $R_{1n}$, $R_{2n}$, and $R_{3n}$ are utilized on the n-side of the circuit of FIG. 8 in order to provide matched circuits at each side of the pseudo-differential amplifier inputs. Thus, these circuits elements act as the matching circuit 65 of FIG. 6 to provide an impedance which matches the impedance seen at the amplifier input node 63. By matching the impedances at each amplifier input node, on chip interference signals at the amplifier input may be minimized. Thus for example, the use of impedance matched inputs may improve the rejection of unwanted interference including amplifier power supply rejection ratio (PSRR). In this manner, balanced impedances may be present at the differential inputs even though the control loop is only operating on one of the amplifier inputs.

The input for the filter on the $V_{inp}$ side of the circuit is shown as the output of charge pump 76 labeled node $CP_{out}$. Outputs of the comparator circuit (not shown) are provided as inputs to the charge pump. The four charge pump inputs include an UP signal indicating the need to increase the voltage at node 63 and a DOWN signal indicating the need to decrease the voltage at node 63. Further, the inverted signals UPb and DOWNb are also provided. As shown in FIG. 8, the four charge pump input signals are provided to the gates of four charge pump input transistors 810. The charge pump output $CP_{out}$ is provided at the node shared by the drain of two of the transistors 810. The node $CP_{hold}$ is provided at the common drain node of the other two transistors 810. The nodes $CP_{out}$ and $CP_{hold}$ are coupled together by a voltage follower amplifier which includes the transistors 812. Bias currents $ibias_1$, $ibias_2$, $ibias_3$, and $ibias_4$ and DC voltages $V_{DC1}$ and $V_{DC2}$ are also provided as shown In operation, the inputs to the charge pump 76 (the outputs from the comparator and low pass filter) are provided at a frequency of 118 MHz to indicate whether charge should be added to or removed from the storage capacitor. Typical values for the various circuit elements of FIG. 8 include:

| | | |
|---|---|---|
| $R_{1p}$ = 2 kΩ | $R_{2p}$ = 2 kΩ | $R_{3p}$ = 1 kΩ |
| $R_{1n}$ = 2 kΩ | $R_{2n}$ = 2 kΩ | $R_{3n}$ = 1 kΩ |
| $C_{sp}$ = 20 pF | $C_{fp}$ = 2 pF | $R_{fp}$ = 60 kΩ |
| $C_{sn}$ = 20 pF | $C_{fn}$ = 2 pF | $R_{fn}$ = 60 kΩ |
| $V_{DC1}$ = 0 V | $V_{DC2}$ = 0 V | |

In an embodiment where it is desirable to conserve power, the resistance of $R_3$ may be lowered and voltages provided at $V_{DC1}$ and $V_{DC2}$. The value of the $ibias_1$ current may be set so that the common mode voltage (the voltage at the attenuator outn node) is approximately 1.8 V. The selection of the common mode voltage is dependent on balancing several factors. For example, it is desirable that the input transistor gates be protected from high voltages and that the amplifier be biased near the half supply value in order to maximize bandwidth. Further, since the low frequency control loop shown herein operates to only pull up the amplifier input node 63, the maximum low frequency voltage level contained in the input signal provided to the amplifier should be less than the common mode voltage so that the low frequency voltage may be controled. The maximum optical pickup head DC voltage is typically approximately 3.4 V and the attenuator provided herein reduces the amplifier input to approximately 1.7 V. Thus, setting ibias 1 such that the common mode voltage applied to amplifier input node 71 is 1.8 V will be sufficient to address the various design considerations present in the exemplary embodiments shown herein.

The ibias$_2$ and ibias$_4$ are set so that the charge from the charge pump provides a voltage step or glitch of less than approximately 50 $\mu$V. It will be recognized that the present invention is not limited though to the specific embodiments shown and numerous other arrangements and values of the circuit elements may be utilized in order to achieve the benefits of the present invention.

Figure 9:
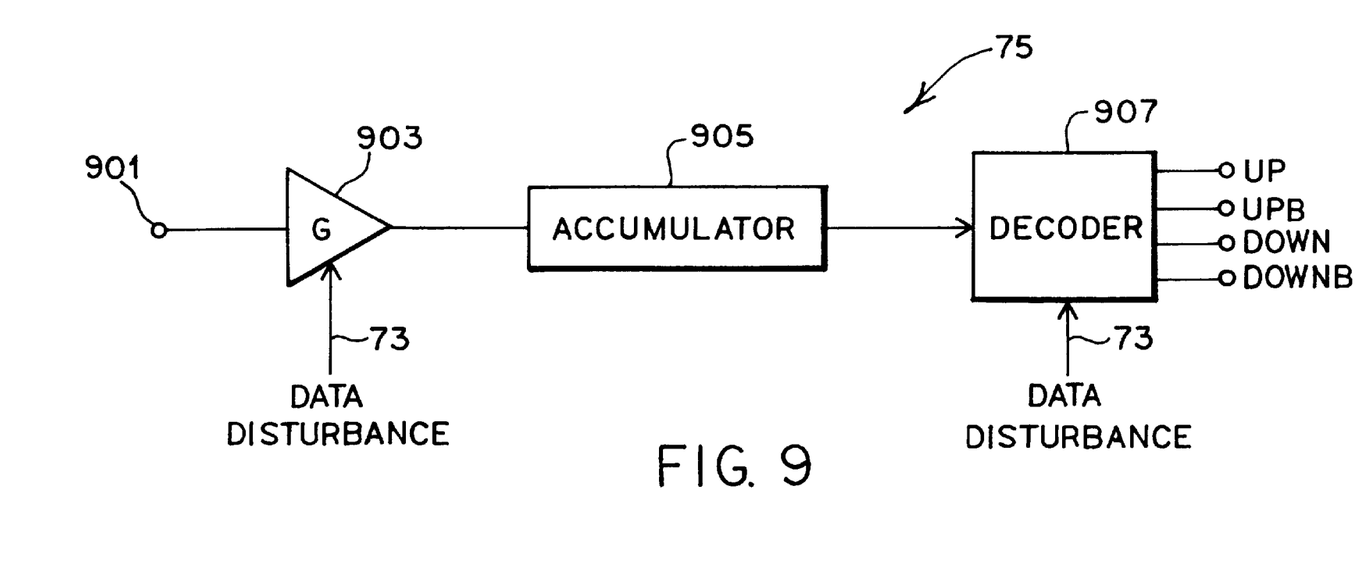
FIG. 9 is illustrative embodiment of a low pass filter of the control circuits of the present invention.

The circuits disclosed herein may be useful with a wide variety of low pass filters. An exemplary low pass filter for use as the low pass filter 75 is shown in FIG. 9. As shown in FIG. 9, the low pass filter receives an input 901 which may be a digital 1 or 0 output provided from the comparator 74. The input 901 is provided to a digital gain stage 903 which has an output coupled to an accumulator 905. The accumulator 905 accumulates the comparator output over a period of time. The accumulator 905 is coupled to a decoder 907. Based upon the data within the accumulator 905, the decoder 907 controls the low pass filter output bits UP, UPB, DOWN, and DOWNB. When a voltage increase is desired, the UP bit is asserted and when a voltage decrease is desired, the DOWN bit is asserted. The decoder may also operate such that when the data within the accumulator indicates that no updates or control is necessary at the amplifier input then neither the UP nor DOWN bit are asserted. Thus even though the comparator 74 constantly has a high or low output, updates are not necessarily always being performed. For example if the amplifier input offset is within a desired level, updates may not be performed. In this manner, unnecessary voltage glitches and updates are limited. In this manner the low pass filter may slow down the updates of the comparator and thus the low pass filter averages out the updates from the comparator. Therefore, updates may be provided to the storage capacitor at a less frequent rate than the clock rate of the comparator.

The decoder 907 may also operate in response to the data disturbance signal 73. When the data disturbance signal 73 indicates a disk data disturbance, the decoder outputs may be controlled such that neither the UP nor DOWN bits are asserted. Thus, when the data disturbance signal 73 is asserted no updates to the amplifier input voltage are made. The data disturbance signal 73 may be asserted for the entire period that the disturbance is detected. In this manner, the control loop is frozen and the control system essentially coasts through defects without making addition control changes at the input to the amplifier.

In addition to coasting through defects, it may be desirable that the control loop operate such that when control is initiated again after a data disturbance, the control loop begins again based upon data which was received just prior to detecting the data disturbance. This may be accomplished by also providing the data disturbance signal 73 to the gain stage 903. When the data disturbance signal 73 indicates the presence of a data disturbance, the gain stage 903 may respond to the data disturbance signal 73 by changing the gain of the gain stage to zero. Therefore, data from the comparator 74 which results from a data disturbance is not stored in the accumulator and the accumulator remains constant at its state just prior to the data disturbance. When the data disturbance ceases, the gain stage is released from a zero gain state and the accumulator begins accumulating data again.

Figure 10:
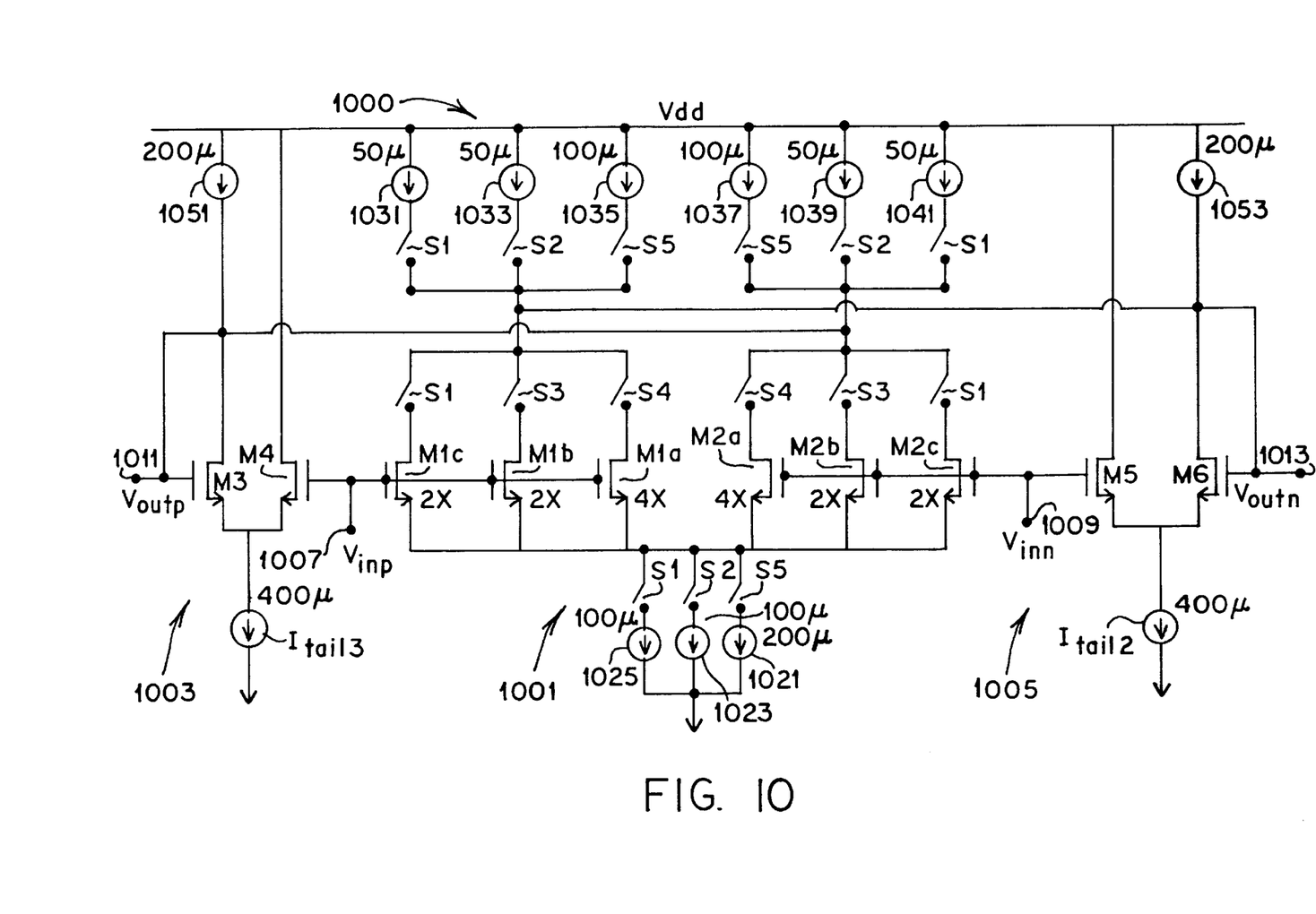
FIG. 10 is illustrative embodiment of an amplifier for use with the present invention.

The circuits disclosed herein may be useful with a wide variety of amplifiers including variable gain amplifiers. FIG. 10 provides an illustrative embodiment for use as variable gain amplifiers 56a and 56b. As shown in FIG. 10, the amplifier 1000 may be formed from three stages, an input stage 1001 and a first output stage 1003 and a second output stage 1005. Differential input signals may be provided at the V$_{inp}$ input 1007 and the V$_{inn}$ input 1009. The differential outputs are provided at the V$_{outp}$ output 1011 and the V$_{outn}$ output 1013.

The input stage 1001 may include a plurality of input transistors. In the example embodiment shown, six input transistors are provided. In particular input transistors M1a, M1b, and M1c and input transistors M2a, M2b, and M2c are provided. These input transistors may be viewed as three matching pairs of input transistors: M1a and M2a, M1b and M2b, and M1c and M2c (as shown in FIG. 10, the input transistors are paired according to the letter a, b, or c). The size of the transistors may be such that the size ratio of the M1:M2:M3 transistors is 2:2:4 as shown in the figure. Each of the input transistors has its drain coupled to at least one switch. In operation, selected input transistors are utilized by activating the switches so that at any given time the input stage is comprised of one or more of the pairs of differential input transistors. More particularly, the switches coupled to the drains of the input transistors are operated so that at any given time the differential pair of input transistors is comprised of one or more of the three pairs of transistors (M1a and M2a, or M1b and M2b, or M1c and M2c).

The drains of the input transistors of the input stage 901 are also switchably coupled to a plurality of current sources 1031 (50 $\mu$A), 1033 (50 $\mu$A), 1035 (100 $\mu$A), 1037 (100 $\mu$A), 1039 (50 $\mu$A), and 1039 (50 $\mu$A). The sources of the input transistors of the input stage 901 are switchably coupled to a tail current which may be comprised of current sources 1021 (100 $\mu$A), 1023 (100 $\mu$A), and/or 1025 (200 $\mu$A). The gates of input transistors M1a, M1b, and M1c are connected to the V$_{inp}$ input 1007 while the gates of the input transistors M2a, M2b, and M2c are connected to the V$_{inn}$ input 1009.

A plurality of switches are provided so that the differential input transistors, the drain currents and the tail currents may be switchably selected in order to obtain the desired coarse gain control. More particularly, a first set of five switches S1, a second set of three switches S2, a third set of two switches S3, a fourth set of two switches S4 and a fifth set of three switches S5 are provided. In operation, all of the S1 switches will be opened or closed together, all of the S2 switches will be opened or closed together, all of the S3 switches will be opened or closed together, etc. For example, if only switches S1 are closed then during operation the input stage will be comprised of drain current sources 1031 and 1041, differential input transistors M1c and M2c, and tail current source 1025. Similar if switches S1 and switches S3 are closed then during operation the input stage will be comprised of drain current sources 1031 and 1041, differential input transistors M1c, M2c, M1b and M2b, and tail current source 1025. Likewise if switches S1, switches S2, and switches S3 are closed then during operation the input stage will be comprised of drain current sources 1031, 1033, 1039 and 1041, differential input transistors M1c, M2c, M1b and M2b, and tail current source 1023 and 1025. In this manner a variety of additional combinations of current sources and transistors may be obtained by selectably opening or closing various combinations of the switches.

The first output stage 1003 of the differential amplifier 1000 includes transistors M3 and M4 having sources coupled to a bias current source $I_{tail3}$. The drain of transistor M3 is coupled to a current source 1051 and also coupled to its gate to form a diode connected transistor. The gate of transistor M3 is coupled to the $V_{outp}$ output 1011 and the drains of the input transistors M2a, M2b, and M2c. The gate of transistor M4 is coupled to the $V_{inp}$ input node 1007. Similarly, the second output stage 1005 is symetrically formed from transistors M5 and M6, bias current source $I_{tail2}$, and current source 1053.

In operation, the amplifier 1000 may be controlled through the switches S1–S5 to provide five different course gain levels. In particular, the gain of the amplifier is adjustable to five different gain levels by adjusting the transconductance of the input stage 1001 to one of four different values. More particularly, the transconductance of the input stage may be adjusted by providing adjusting the effective transistor size of the input transistors utilized in the amplifier and/or adjusting the current through the transistors. The selectable operation switches S1–S5 provides the user with a means to adjust both the transistor size and current parameters. In one embodiment, the course gain control may provide five course gain control levels from −6 dB to +6 dB. More particularly, the table below illustrates the state of the switches for the desired coarse gain level:

| GAIN  | S1     | S2     | S3     | S4     | S5     |
|-------|--------|--------|--------|--------|--------|
| −6 dB | closed | opened | opened | opened | opened |
| −3 dB | closed | opened | closed | opened | opened |
| 0 dB  | closed | closed | closed | opened | opened |
| +3 dB | closed | opened | opened | closed | closed |
| +6 dB | closed | closed | closed | closed | closed |

The course gain control provided herein may also be halted or frozen similar to the amplifier control loop as discussed above when a data disturbance is detected. Thus, when a data disturbance is detected the control signals to the switches may be held so that the coarse gain is held constant throughout a data disturbance.

The switches S1–S5 may be formed from either n-channel or p-channel transistors. However, in a preferred embodiment each switch coupled between the current sources 1031, 1033, 1035, 1037, 1039, and 1041 and the drains of the differential input transistors M1a, M1b, M1c, M2a, M2b, and M2c are all formed by using a p-channel device. Thus, the drain switching utilized by may achieved through the using only p-channel transistors for the switches coupled to the input transistor drains. The switches coupled to the tail current sources 1021, 1023 and 1025 may be n-channel transistors. The use of p-channel switches may be particularly advantages in light of the specific data storage system and control techniques shown herein. More particularly, as discussed above an exemplary circuit may include a common mode voltage of approximately 1.8 V. Further, the amplifier shown herein operates such that the common mode voltage at the input is approximately equal to the common mode voltage at the output. Thus, the magnitudes of the DC voltages at the outputs 1013 and 1011 of the amplifier 1000 shown in FIG. 10 may approach 1.8 V. If n-channel devices were chosen as the drain switches, with a voltage of 1.8 V the transistor switches may be close to or within the transistor active state region rather than only within the transistor triode state (or resistive region). The selection of p-channel devices ensures that for the exemplary circuit conditions disclosed herein the transistors utilized for the drain switches operate as a resistive switch (triode region operation). The use of p-channel drain switches need not be limited to the specific amplifier design and application shown herein. More particularly, the p-channel drain switching techniques will be advantageous in other designs and applications where low power supply voltages are encountered.

Thus, as described above, the amplifier 1000 provides for a course gain control to one of five different levels through the use of drain switches. By utilizing the drain switches shown herein, coarse gain control of the amplifier may be obtained without substantially affecting the bandwidth of the amplifier. The use of drain switching provides gain control which substantially does not affect the dominate pole of the amplifier which is to a first order the transconductance of each output stage divided by the total parasitic capacitance of the input and output stages. More particularly, the use of drain switches does not significantly change the total parasitic capacitance since the additional parasitic capacitance created by adding the switching devices is relatively small compared to the total parasitic capacitance. Further, the switches do not significantly impact the output impedance of the amplifier since the output impedance is predominately impacted by the impedance of the node which is driven by the low resistance value produced by the diode connected transistor in each output stage. Thus, the switches which are coupled to the input transistor drains and the output nodes do not significantly degrade the bandwidth of the amplifier.

Though the drain switching shown with respect to FIG. 10 illustrates switching of both the input transistors to achieve a transistor size (W/L) change and a change in the drain current, each of these changes could also be made independently to adjust the course gain control. Thus, the amplifier 1000 could be comprised of a single set of differential input transistors which are coupled to multiple drain current sources through drain switches or alternatively a single set of drain current sources may be provided which are drain switch coupled to multiple differential input transistor pairs. However, it may be preferential to adjust both the current sources and the input transistor device sizes so as to maintain a relatively constant current density. The switchable transistor sizes and current values shown for the input stage 1001 of FIG. 10 provide such a benefit for the 6 dB, 0 dB, and −6 dB gain levels. In this manner, both the input stage and output stage current densities may be maintained relatively constant for a majority of the gain levels to improve the distortion performance of the amplifier. By utilizing additional switches, the constant current densities could also be constant for the remaining gain levels. Whether all, some or no current densities are maintained constant is a design consideration in which the additional circuit complex should be compared to the distortion performance improvement obtained.

The drain switching techniques disclosed herein are also advantageous in that the switches do not significantly degrade the distortion performance of the amplifier even though the switches are located within the signal path. More particularly, the input stage converts the input signal voltage to a current through the transconductance of the differential input transistors which is to a first order unaffected by the presence of the drain switches. The current is then dropped across the output stage devices which effectively convert the current signal back into a voltage signal. If the input and output stage devices have approximately the same current density, then the conversion of the signal from a voltage signal to a current signal and back to a voltage signal will occur with minimum distortion.

It will be recognized that the course gain techniques disclosed herein are just one exemplary embodiment of course gain control. Other specific implementations of course gain control and/or drain switching may be utilized while still obtaining the general benefits of implementing a data detection system having separate course gain control and/or drain switching. Though shown herein with respect to drain switching on the input stage, it may also be recognized that drain switching may be utilized within the output stages. Thus, for example, if additional output transistors are provided in place of an output transistors M4 or M5, drain switching may be utilized to selectively switch into the output stage transistors having different voltages connected to the output stage transistors in order to achieve a course gain adjustment.

The circuits disclosed herein may be used with a wide variety of comparators and the invention is not limited to any one type of comparator. One example comparator for use as comparator 74 may be seen in U.S. patent application Ser. No. 08/927,122, entitled Method and System For Sliced Integration Of Flash Analog to Digital Converters In Read Channel Circuits, to Marius Goldenberg and Russell Croman, filed Sep. 5, 1997, the disclosure of which is expressly incorporated herein by reference.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements may be substituted for those illustrated and described herein, and certain features of the invention may be utilized independently of the use of other features, all as would be apparent to one skilled in the art after having the benefit of this description of the invention.

What is claimed is:

1. A method of controlling the output of an amplifier, comprising:

amplifying a data signal with the amplifier to generate an amplifier output, the data signal including unwanted low frequency variations and the amplifier exhibiting input offsets;

coupling a control loop between an amplifier input node that receives the data signal and the amplifier output node; and compensating the input offset of the amplifier and controlling the low frequency content of the data signal with the control loop to minimize offset voltages and low frequency signals at the amplifier output node.

2. The method of claim 1, further comprising:

interrupting the compensating and controlling step when a disturbance in the data signal occurs.

3. The method of claim 2, the amplifier being a differential amplifier.

4. The method of claim 3, the control loop being coupled to only one input of the amplifier.

5. A method of operating an electrical circuit, comprising:

providing a single ended input signal to a first input node of a differential amplifier;

providing a control loop from an output of the amplifier to the first input node; and matching the amplifier input impedance at the second input node to the amplifier input impedance of the first input node.

6. The method of claim 5, further comprising:

compensating the amplifier input offset and controlling the low frequency content of the data signal with the control loop to minimize offset voltages and low frequency signals at the amplifier output node.

7. The method of claim 6, further comprising:

interrupting the compensating and controlling step when a disturbance in the data signal occurs.

8. The method of claim 6, the matching being accomplished at least in part by replicating at least a portion of the control loop at the second input node.

9. A data detection circuit capable of being coupled to a data storage medium to receive a data signal, comprising:

an amplifier within the data detection circuit, the amplifier coupled to the data signal; and means for simultaneously compensating the input offset voltage of the amplifier and controlling the low frequency content of the data signal, the means also allowing the compensation and control to be halted in a hold state, the means comprising a control loop coupled between an input and an output of the amplifier, the control loop comprising a charge pump and a storage capacitor.

10. The circuit of claim 9, the amplifier being a differential amplifier, the control loop being coupled only to one input of the differential amplifier.

11. A data detection circuit, comprising:

a plurality of differential data inputs, the differential data inputs capable of receiving data from a data storage medium;

at least one differential amplifier;

a first amplifier input node of the differential amplifier coupled to at least one of the plurality of differential data inputs;

a second amplifier input node of the differential amplifier coupled to at least one of the plurality of differential data inputs;

a control loop coupled to the first amplifier input node and to at least one output node of the differential amplifier; and an impedance matching circuit coupled to the second amplifier input node, the impedance matching circuit creating an input impedance at the second amplifier input node that matches an input impedance at the first amplifier input node.

12. The circuit of claim 11, the control loop generating a control signal, the control signal being provided to the first input to compensate for input offsets and control low frequency content of the data signal.

13. The circuit of claim 11, further comprising:

a data disturbance signal coupled to the control loop, the control loop responsive to the data disturbance to interrupt a control signal of the control loop.

14. The circuit of claim 12, further comprising:

a data disturbance signal coupled to the control loop, the control loop responsive to the data disturbance to interrupt a control signal of the control loop.

* * * * *